US009515567B2

(12) United States Patent
Li et al.

(10) Patent No.: US 9,515,567 B2
(45) Date of Patent: Dec. 6, 2016

(54) RADIO FREQUENCY POWER SOURCE HAVING PRECISE POWER DETECTOR

(71) Applicant: THE INSTITUTE OF MICROELECTRONICS OF CHINESE ACADEMY OF SCIENCES, Beijing (CN)

(72) Inventors: Yongtao Li, Liuzhou (CN); Zhangyan Zhao, Yantai (CN); Wei Qin, Xuzhou (CN); Yingjie Li, Beijing (CN); Yang Xia, Nanchang (CN)

(73) Assignee: THE INSTITUTE OF MICROELECTRONICS OF CHINESE ACADEMY OF SCIENCES, Beijing (JP)

( * ) Notice: Subject to any disclaimer, the term of this patent is extended or adjusted under 35 U.S.C. 154(b) by 0 days.

(21) Appl. No.: 14/361,613

(22) PCT Filed: Sep. 27, 2012

(86) PCT No.: PCT/CN2012/082209
§ 371 (c)(1),
(2) Date: May 29, 2014

(87) PCT Pub. No.: WO2013/078909
PCT Pub. Date: Jun. 6, 2013

(65) Prior Publication Data
US 2014/0334209 A1  Nov. 13, 2014

(30) Foreign Application Priority Data
Nov. 30, 2011  (CN) .......................... 2011 1 0389185

(51) Int. Cl.
*H04B 17/00* (2015.01)
*G01R 31/00* (2006.01)
(Continued)

(52) U.S. Cl.
CPC .............. *H02M 7/066* (2013.01); *G01R 27/00* (2013.01); *G01R 31/00* (2013.01);
(Continued)

(58) Field of Classification Search
CPC ............. H01J 37/32174; H01J 37/321; H01J 37/32082; H01J 37/32935; H03G 3/3042; H03G 3/3047; H04W 52/30; H04B 1/40; H04B 1/036; H05H 1/0081
USPC ............. 315/111.21, 111.31, 111.41, 111.51; 324/105–126, 95; 702/60–64; 118/712
See application file for complete search history.

(56) References Cited

U.S. PATENT DOCUMENTS 4,041,395 A * 8/1977 Hill ........................ H03H 11/30
                                                        324/140 D
5,287,555 A * 2/1994 Wilson et al. ............. 455/115.1
(Continued)

FOREIGN PATENT DOCUMENTS

| CN | 101529551 A | 9/2009 |
| CN | 101933225 A | 12/2010 |
| CN | 102255606 A | 11/2011 |

OTHER PUBLICATIONS

Richard A Scholl Forward and reflected power. What do they mean? http://www.advanced-energy.com/upload/File/White_Papers/SL-WHITE7-270-01.pdf Oct. 2006.*
(Continued)

*Primary Examiner* — Alexander H Taningco
*Assistant Examiner* — Renan Luque
(74) *Attorney, Agent, or Firm* — Oliff PLC

(57) ABSTRACT

A radio frequency (RF) power source having a precise power detector includes a RF signal generator, a RF power amplifying circuit, a power supply circuit, and a precise power detector. The precise power detector includes a voltage mutual inductor, a current mutual inductor, a precise detecting module, and a microcontroller integrated with an analog-digital (A/D) converter and a micro-processing unit, wherein the voltage mutual inductor and the current mutual inductor are respectively connected with the precise detecting module. The precise detecting module includes an add circuit, a subtraction circuit, a rectification circuit, and a filtering-amplifying circuit, wherein the add circuit and the subtraction circuit are respectively connected with the rectification circuit, the rectification circuit connects to the filtering-amplifying circuit, the filtering-amplifying circuit connects to the microcontroller integrated with the A/D converter and the micro-processing unit.

18 Claims, 3 Drawing Sheets

(51) Int. Cl.
*G01R 27/00* (2006.01)
*H02M 7/66* (2006.01)
*H01J 37/32* (2006.01)
*H02M 7/06* (2006.01)
*H03F 3/195* (2006.01)
*H03F 3/45* (2006.01)

(52) U.S. Cl.
CPC .. *H01J 37/32082* (2013.01); *H01J 37/32174* (2013.01); *H01J 37/32935* (2013.01); *H03F 3/195* (2013.01); *H03F 3/45475* (2013.01); *H04B 17/00* (2013.01); *H03F 2203/45138* (2013.01); *H03F 2203/45518* (2013.01); *H03F 2203/45528* (2013.01)

(56) References Cited

U.S. PATENT DOCUMENTS

| | | | |
|---|---|---|---|
| 5,543,689 A | 8/1996 | Ohta et al. | |
| 5,770,922 A * | 6/1998 | Gerrish et al. | 315/111.21 |
| 6,449,568 B1 * | 9/2002 | Gerrish | 702/60 |
| 2004/0150386 A1 * | 8/2004 | Gonzalez et al. | 324/117 R |
| 2004/0181718 A1 * | 9/2004 | Long | 714/724 |
| 2006/0220573 A1 | 10/2006 | Kotani et al. | |

OTHER PUBLICATIONS

Dragos Ducu (Op amp rectifiers, Peak detector and clamps), Microchip Technology Inc. Feb. 8, 2011 http://ww1.microchip.com/downloads/en/AppNotes/01353A.pdf.*

Chen, Wai-Kai. (2009). Circuits and Filters Handbook (3rd Edition)—Passive, Active, and Digital Filters. Taylor & Francis. Online version available at: http://app.knovel.com/hotlink/toc/id:kpCFHEPAD2/circuits-filters-handbook/circuits-filters-handbook.*

International Search Report issued in PCT/CN2012/082209 mailed Dec. 13 2012.

* cited by examiner

RADIO FREQUENCY POWER SOURCE HAVING PRECISE POWER DETECTOR

TECHNICAL FIELD

The present invention relates to a RF (radio frequency) power supply, in particular to a RF power supply with a precise power detector.

BACKGROUND OF THE INVENTION

A RF power supply is a device for generating RF power signals, and is a core component of the semiconductor process equipment. All the equipments that generate plasma for processing material need the RF power supply to provide energy. Process manufacturing equipments of integrated circuits, solar cells and LEDs (Light Emitting Diodes), such as etcher, PVD (Physical Vapor Deposition) equipment, PECVD (Plasma Enhanced Chemical Vapor Deposition) equipment, ALD (Atomic layer deposition) equipment and so on are equipped with the RF power supplies with different power specifications.

A RF power supply is generally composed of a RF signal generator, a RF power amplifying circuit, power supplying lines and a RF power detector. Currently, the integrated circuit manufacturing industry develops toward a goal of making a linewidth thinner. In the manufacturing process, the linewidth is changed from 90 nm, 65 nm, 45 nm, to the latest 32 nm. This brings higher requirements to the output power of the RF power supply. That is to say, the fluctuation range of the output power should be small enough. As to the output power control of the RF power supply, it is essential whether the detection of the RF power is accurate.

It is impossible for an existing RF power detector to achieve the consistency of the accuracy of the RF power detection since the detecting circuit of the existing RF power detector has a big dead-band, and a small dynamic range. That is to say, since there are large errors during the detection of small RF power, it is uncertain whether the process equipment can process a wafer with a smaller linewidth. As to the 32 nm manufacturing process, if the existing technology is used, it is impossible to achieve a thin linewidth, and thus an expected pattern, this finally results a failure of the manufacturing process.

SUMMARY OF THE INVENTION

The technical problem to be solved by the present invention is to provide a RF power source having a precise power detector, which can achieve high precise RF power detection with a wide detection range, good consistency of accuracy, and a small dead-band.

In order to solve above-mentioned technical problem, the present invention provides a RF power supply with a precise power detector, the RF power supply comprises a RF signal generator, a RF power amplifying circuit, power supplying lines, and a precise power detector. The precise power detector comprises a voltage mutual inductor, a current mutual inductor, a precise detecting module and a microcontroller integrated with an analog-digital converter and a micro-processing unit, wherein the voltage mutual inductor and the current mutual inductor are respectively connected to the precise detecting module. The precise detecting module comprises an add circuit, a subtraction circuit, a rectification circuit and a filtering-amplifying circuit, wherein the adding circuit performs an addition on the signals from the voltage mutual inductor and the current mutual inductor, and the subtraction circuit performs a subtraction on the signals from the voltage mutual inductor and the current mutual inductor, the add circuit and the subtraction circuit are respectively connected to the rectification circuit, the rectification circuit is connected to the filtering-amplifying circuit, the filtering-amplifying circuit is connected to the microcontroller.

Furthermore, the present invention has the following characteristics: the precise detecting module further comprises a multi-way switch, an input terminal of which is respectively connected to an output terminal of the add circuit and an output terminal of the subtraction circuit, the multi-way switch transfers an output signal of the add circuit and an output signal of the subtraction circuit to the rectifying circuit according to an instruction of the microcontroller.

Furthermore, the present invention has the following characteristics: the rectification circuit comprises a rectifying operational amplifier and detecting diodes, an anode of one detecting diode is connected to an inverting input terminal of the rectifying operational amplifier, and a cathode of the detecting diode is connected to an output terminal of the rectifying operational amplifier, another detecting diode is disposed between the output terminal of the rectifying operational amplifier and an input terminal of the filtering-amplifying circuit.

Furthermore, the present invention has the following characteristics: the voltage level of a non-inverting input terminal of the rectifying operational amplifier is less than 0.01 volt.

Furthermore, the present invention has the following characteristics: the detecting diodes are Schottky diodes with low break-over voltage.

Furthermore, the present invention has the following characteristics: the rectifying operational amplifier is a high-speed operational amplifier with a bandwidth greater than 1 GHz.

Furthermore, the present invention has the following characteristics: the filtering-amplifier circuit is a first-order filtering-amplifier circuit composed of operational amplifiers, resistors, and capacitors.

Furthermore, the present invention has the following characteristics: the filtering-amplifier circuit is a second-order filtering-amplifier circuit composed of operational amplifiers, resistors, and capacitors.

Furthermore, the present invention has the following characteristics: the resistances of an input resistor of the rectifying operational amplifier, a feedback resistor connected between the inverting input terminal and the output terminal of the rectifying operational amplifier, and a resistor of the filtering-amplifier circuit are configured according to the gain and the input range of the precise detecting module.

Furthermore, the present invention has the following characteristics: the work frequency of the RF power supply is 2 MHz, 13.56 MHz or 27.12 MHz.

By comparing with the prior art, the present invention has following advantages:

A. as the present invention uses the precise detecting module instead of the existing technical solution in which only detecting diodes are used, the dynamic characteristics of the detecting diodes are associated with the rectifying operational amplifier, and have an IV curve crossing zero, a large detecting range, a small dead-band, a large detecting dynamic range, and good consistency of accuracy;

B. by using a multi-way switch, the present invention may achieve the multiplexing of the rectification circuit and the filtering circuit, and thus simplify components and reduce cost;
C. as the input impedance of the rectification circuit in the present invention is 50 ohm, it is conducive to the impedance matching of RF signals;
D. as the detecting diodes in the present invention use Schottky diodes with low break-over voltage, and the rectifying operational amplifier uses a high-speed operational amplifier with a large bandwidth, it is ensured that a half wave of a RF signal with a frequency of 2 MHz, 13.56 MHz or 27.12 MHz that is commonly used in the semiconductor process equipments is distortionless, and has a high detecting accuracy.

DETAILED DESCRIPTION OF THE PRESENTLY PREFERRED EMBODIMENTS

Hereinafter, the present invention will be described in detail with respect to the appended figures and the specific embodiments for deep comprehension. The present invention provides a RF power supply with a precise power detector. Generally, the RF power supply may be a valve-type RF power supply or a transistor-type RF power supply, and comprises a RF signal generator, a RF power amplifying circuit, power supplying lines, and a precise power detector. Furthermore, the present RF power supply further comprises a main controller and a human-machine interface, etc. The RF signal generator is respectively connected to the RF power amplifying circuit, the power supplying lines, and the main controller. The RF power amplifying circuit is respectively connected to the power supplying lines, the precise power detector, and the main controller. The main controller is respectively connected to the power supplying lines and the precise power detector. The work frequency of the RF power supply may be 2 MHz, 13.56 MHz or 27.12 MHz.

Figure 1:
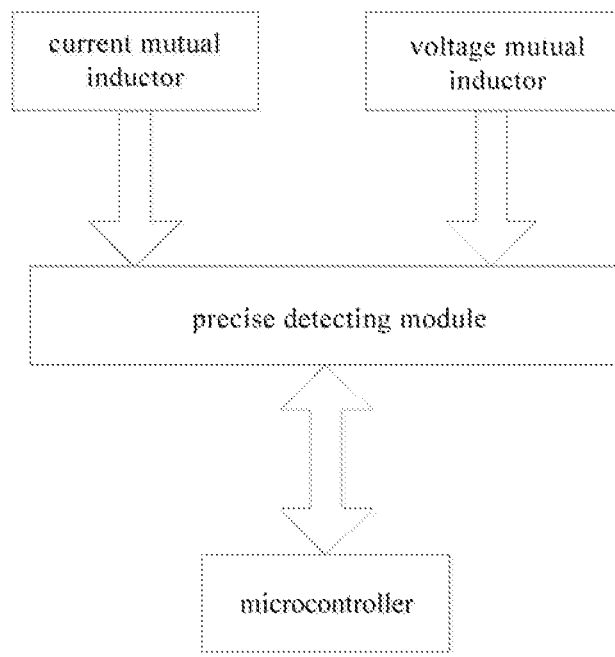
FIG. 1 is a schematic block diagram of a precise power detector of a RF power supply of the present invention.

As shown in FIG. 1, the precise power detector of the present invention comprises a voltage mutual inductor, a current mutual inductor, a precise detecting module and a microcontroller. The voltage mutual inductor and the current mutual inductor are respectively connected to the precise detecting module. The precise detecting module is connected to the microcontroller. The voltage mutual inductor can be formed by connecting a mutual inductive coil to a RF signal input terminal in parallel with the ground, wherein the turn ratio of the mutual inductive coil is determined according to the gain of the precise detecting module. The scheme using a capacitive voltage divider can also be used. The current mutual inductor can be formed by connecting a mutual inductive coil in series between the RF signal input terminal and a RF signal output terminal of the precise detecting module, wherein the turn ratio of the mutual inductive coil is determined according to the gain of the precise detecting module. The microcontroller is integrated with an analog-digital converter and a micro-processing unit. In some applications, this microcontroller may be a singlechip, preferably a C8051F singlechip.

Figure 2:
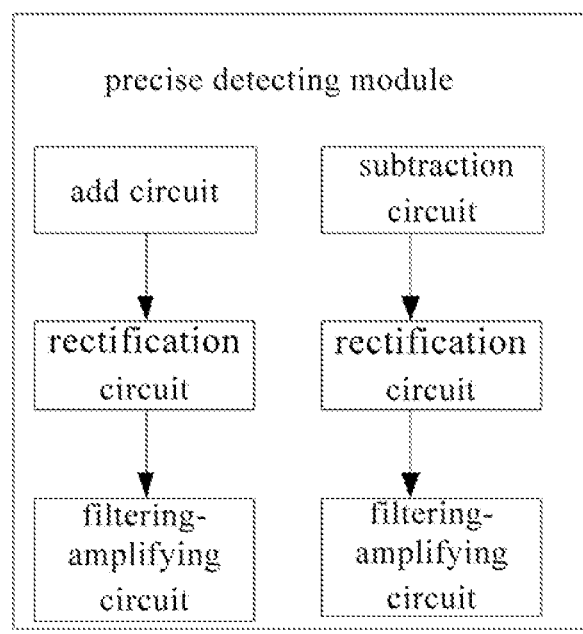
FIG. 2 is a schematic diagram of a first embodiment of a precise detecting module of the precise power detector of the present invention.

As shown in FIG. 2, the precise detecting module comprises an add circuit, a subtraction circuit, a rectification circuit and a filtering-amplifying circuit. The adding circuit performs an addition on the signals from the voltage mutual inductor and the current mutual inductor. The result of the addition is used to represent an incident power (sometimes also referred to as forward power). The subtraction circuit performs a subtraction on the signals from the voltage mutual inductor and the current mutual inductor. The result of the subtraction is used to represent an reflected power (sometimes also referred to as backward power). The add circuit and the subtraction circuit are respectively connected to the rectification circuit. The rectification circuit is connected to the filtering-amplifying circuit, the filtering-amplifying circuit is connected to the microcontroller.

Figure 3:
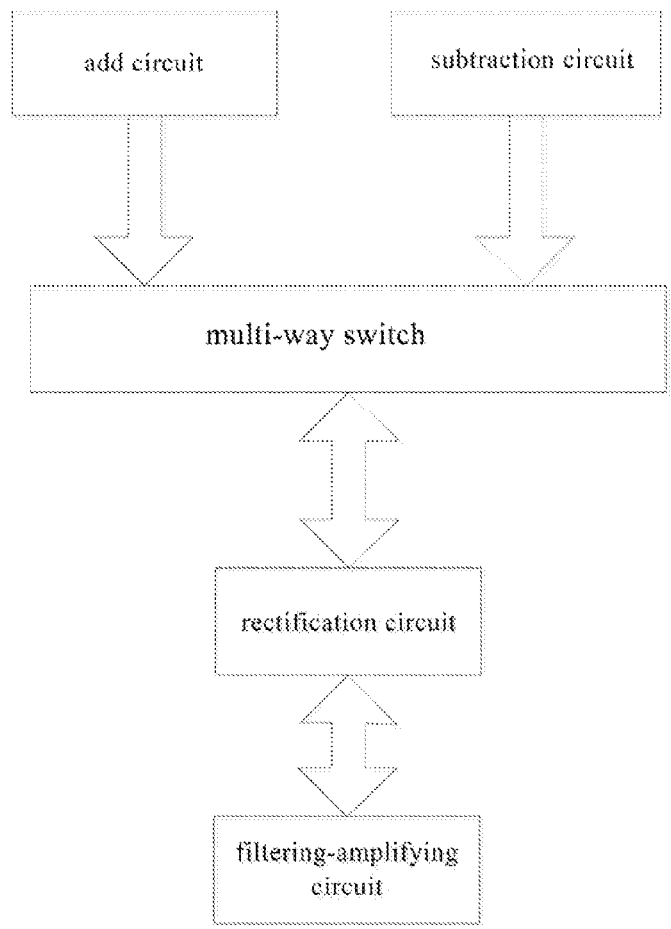
FIG. 3 is a schematic diagram of a second embodiment of a precise detecting module of the precise power detector of the present invention.

As shown in FIG. 3, the precise detecting in further comprises a multi-way switch, an input terminal of which is respectively connected to an output terminal of the add circuit and an output terminal of the subtraction circuit. According to the instructions of the microcontroller, this multi-way switch outputs an output signal of the add circuit and an output signal of the subtraction circuit to the rectification circuit. By comparing with the embodiment shown in FIG. 2, the embodiment shown in FIG. 3 only uses one rectification circuit and one filtering-amplifying circuit. Thus, the number of components and the cost are reduced.

Figure 4:
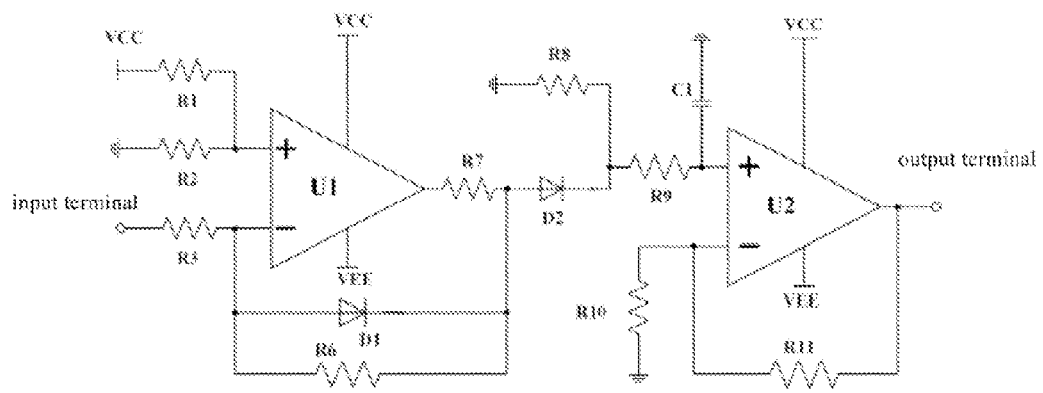
FIG. 4 is a schematic diagram of a first embodiment of a rectification circuit and a filtering-amplifying circuit of the precise detecting module of the present invention.

It is shown in FIG. 4 that the first embodiment of a rectification circuit and a filtering-amplifying circuit of the precise detecting module of the present invention. The rectification circuit mainly comprises a rectifying operational amplifier U1 and detecting diodes D1, D2. An anode of the detecting diode D1 is connected to an inverting input terminal of the rectifying operational amplifier U1, and a cathode of the detecting diode D1 is connected to an output terminal of the rectifying operational amplifier U1. The detecting diode D2 is disposed between the output terminal of the rectifying operational amplifier U1 and an input terminal of the filtering-amplifying circuit.

The detecting diodes D1, D2 may be Schottky diodes with low break-over voltage, preferably IN5711 model diodes. The rectifying operational amplifier is a high-speed operational amplifier with a bandwidth greater than 1 GHz, preferably a high-speed operational amplifier OPA657 with 1.6 GHz bandwidth made of Texas Instruments. The dynamic characteristics of the detecting diodes D1, D2 are associated with the rectifying operational amplifier U1, and have an IV curve crossing zero, a large detecting range, a small dead-band, a large detecting dynamic range, and good consistency of accuracy.

The non-inverting input terminal of the rectifying operational amplifier U1 is provided with resistors R1 and R2 joined in the form of dividing voltage, wherein the resistance of the resistor R1 is at least 1000 times more than the resistance of the resistor R2 so as to ensure that the voltage level of the non-inverting input terminal of the rectifying operational amplifier is less than 0.01 volt, i.e., almost zero level.

The inverting input terminal of the rectifying operational amplifier U1 is provided with a resistor R3. The resistance of the resistor R3 is preferably 50 ohm, which is conducive to the impedance matching of RF signals. This is because the characteristic impedance of each of RF transmission lines used in semiconductor equipments is 50 ohm. A feedback resistor R6 is provided between the inverting input terminal and the output terminal of the rectifying operational amplifier U1. The resistance of the feedback resistor R6 is determined according to the gain and the input range of the precise detecting module. A resistor R7 is provided between the output terminal of the rectifying operational amplifier U1 and the anode of the detecting diode D2.

The filtering-amplifying circuit is mainly composed of operational amplifiers, resistors, and capacitors. The non-inverting terminal of an operational amplifier U2 is connected to an input resistor R9 and a capacitor C1. The other terminal of the resistor R9 is respectively connected to an output terminal of rectifying circuit (i.e., the cathode of the detecting diode D2) and a ground resistor R8. The capacitor C1 is connected to the ground. Resistors R10, R11 is provided between the inverting input terminal and the output terminal of the operational amplifier U2. The resistances of these resistors may be determined according to the gain and the input range of the precise detecting module. From this, a first-order filtering-amplifier circuit is formed, and finally an analog signal representing incident power or reflected power, which can be processed by the microprocessor, is output.

Figure 5:
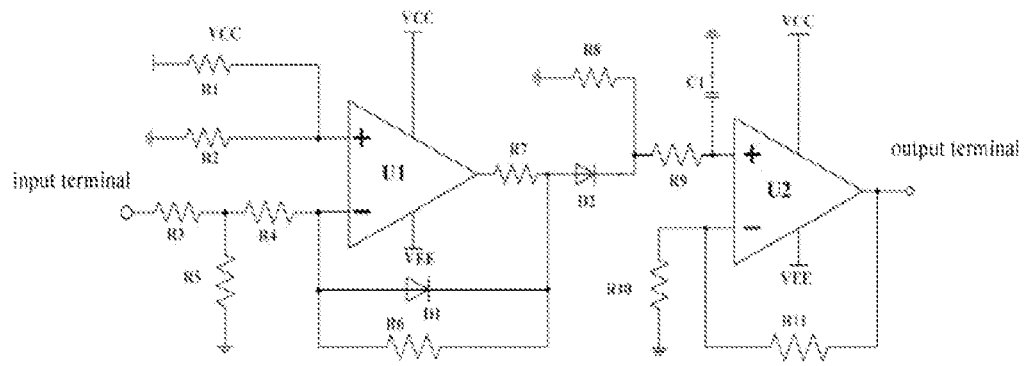
FIG. 5 is a schematic diagram of a second embodiment of the rectification circuit and the filtering-amplifying circuit of the precise detecting module of the present invention.

It is shown in FIG. 5 that the second embodiment of the rectification circuit and the filtering-amplifying circuit of the precise detecting module of the present invention. By comparing with the embodiment shown in FIG. 4, the embodiment shown in FIG. 5 only has modifications with respect to the input resistors of the rectification circuit. Instead of using one input resistor R3, the embodiment shown in FIG. 5 uses resistors R3, R4, and R5 to form a T-shape network. This solution can achieve the division of current and voltage during the input of large signals, reduce the power consumption on the resistors, protect the rectifying operational amplifier, and thus enlarge the input range of the precise detecting module (i.e., the embodiment shown in FIG. 4 cannot detect RF signals with large power, hut the embodiment shown in FIG. 5 can do it). The resistances of these resistors may be determined according to the gain and the input range of the precise detecting module.

Figure 6:
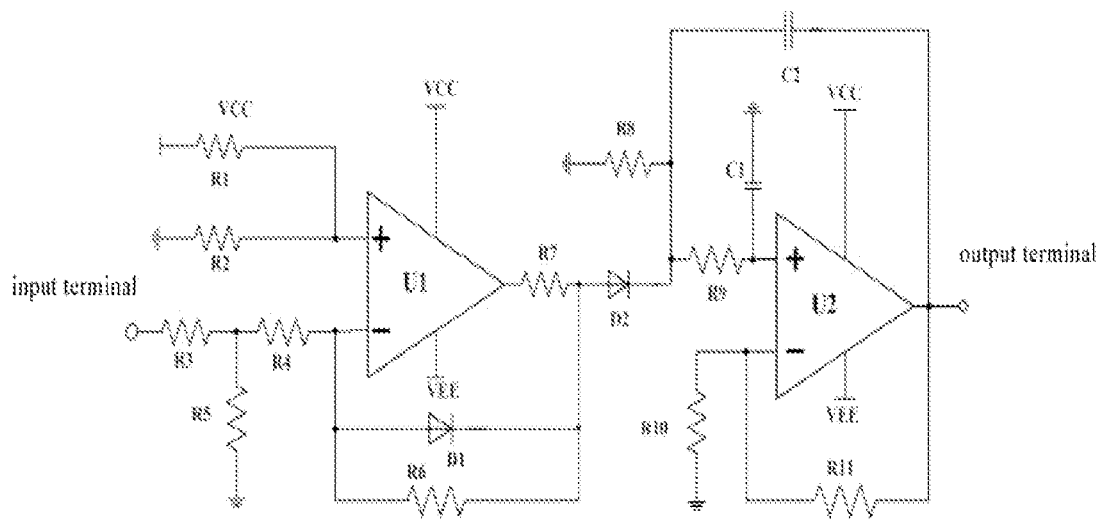
FIG. 6 is a schematic diagram of a third embodiment of the rectification circuit and the filtering-amplifying circuit of the precise detecting module of the present invention.

It is shown in FIG. 6 that the third embodiment of the rectification circuit and the filtering-amplifying circuit of the precise detecting module of the present invention. By comparing with the embodiment shown in FIG. 5, the embodiment shown in FIG. 6 uses a second-order filtering-amplifying circuit instead of the first-order filtering-amplifying circuit. This manner is beneficial in filtering more harmonic waves so as to ensure the analog-digital converter within the microcontroller to obtain more accurate numerical values (i.e., the numerical values represent the incident power and the reflected power) for further operational processes of the microprocessor.

The preferred embodiment further describes the objects, technical scheme and beneficial effects of the present invention in detail. It should be understood that the foregoing description is only intended to illustrate a specific embodiment of the invention and not to limit the invention. Any modification, equivalent replacement and improvement made to the embodiment without departing from the spirit and principles of the invention should fall within the protection scope of the invention.

What is claimed is:
1. A radio frequency (RF) power supply comprising:
a RF signal generator,
a RF power amplifying circuit,
power supplying lines, and
a precise power detector including:
    a precise detecting module including: (i) an add circuit, (ii) a subtraction circuit, (iii) a rectification circuit including at least two detecting diodes and a first operational amplifier, and (iv) a filtering-amplifying circuit including a capacitor and a second operational amplifier,
    a voltage mutual inductor directly connected to the precise detecting module,
    a current mutual inductor directly connected to the precise detecting module, and
    a microcontroller integrated with an analog-digital converter and a micro-processing unit, wherein:
the add circuit performs an addition on the signals from the voltage mutual inductor and the current mutual inductor, the subtraction circuit performs a subtraction on the signals from the voltage mutual inductor and the current mutual inductor, and
the add circuit and the subtraction circuit are respectively connected to the rectification circuit, the rectification circuit is connected to the filtering-amplifying circuit, and the filtering-amplifying circuit is connected to the microcontroller.

2. The RF power supply of claim 1, wherein the precise detecting module further comprises:
a multi-way switch, an input terminal of which is respectively connected to an output terminal of the add circuit and an output terminal of the subtraction circuit, the multi-way switch transfers an output signal of the add circuit and an output signal of the subtraction circuit to the rectification circuit according to an instruction of the microcontroller.

3. The RF power supply of claim 1, wherein
an anode of one of the at least two detecting diodes is connected to an inverting input terminal of the rectifying operational amplifier, and a cathode of the one of the at least two detecting diodes is connected to an output terminal of the rectifying operational amplifier, and another of the at least two detecting diodes is disposed between the output terminal of the rectifying operational amplifier and an input terminal of the filtering-amplifying circuit.

4. The RF power supply of claim 3, wherein the voltage level of a non-inverting input terminal of the rectifying operational amplifier is less than 0.01 volt.

5. The RF power supply of claim 4, wherein the detecting diodes are Schottky diodes with low break-over voltage.

6. The RF power supply of claim 5, wherein the rectifying operational amplifier is a high-speed operational amplifier with a bandwidth greater than 1 GHz.

7. The RF power supply of claim 6, wherein the filtering-amplifier circuit is a first-order filtering-amplifying circuit composed of operational amplifiers, resistors, and capacitors.

8. The RF power supply of claim 6, wherein the filtering-amplifier circuit is a second-order filtering-amplifying circuit composed of operational amplifiers, resistors, and capacitors.

9. The RF power supply of claim 8, wherein the resistances of an input resistor of the rectifying operational amplifier, a feedback resistor connected between the inverting input terminal and the output terminal of the rectifying operational amplifier, and a resistor of the filtering-amplifying circuit are configured according to the gain and the input range of the precise detecting module.

10. The RF power supply of claim 9, wherein the work frequency of the RF power supply is 2 MHz, 13.56 MHz or 27.12 MHz.

11. The RF power supply of claim 2, wherein
an anode of one of the at least two detecting diodes is connected to an inverting input terminal of the rectifying operational amplifier, and a cathode of the one of the at least two detecting diodes is connected to an output terminal of the rectifying operational amplifier, and another of the at least two detecting diodes is disposed between the output terminal of the rectifying operational amplifier and an input terminal of the filtering-amplifying circuit.

12. The RF power supply of claim 11, wherein the voltage level of a non-inverting input terminal of the rectifying operational amplifier is less than 0.01 volt.

13. The RF power supply of claim 12, wherein the detecting diodes are Schottky diodes with low break-over voltage.

14. The RF power supply of claim 13, wherein the rectifying operational amplifier is a high-speed operational amplifier with a bandwidth greater than 1 GHz.

15. The RF power supply of claim 14, wherein the filtering-amplifying circuit is a first-order filtering-amplifier circuit composed of operational amplifiers, resistors, and capacitors.

16. The RF power supply of claim 14, wherein the filtering-amplifier circuit is a second-order filtering-amplifying circuit composed of operational amplifiers, resistors, and capacitors.

17. The RF power supply of claim 16, wherein the resistances of an input resistor of the rectifying operational amplifier, a feedback resistor connected between the inverting input terminal and the output terminal of the rectifying operational amplifier, and a resistor of the filtering-amplifying circuit are configured according to the gain and the input range of the precise detecting module.

18. The RF power supply of claim 17, wherein the work frequency of the RF power supply is 2 MHz, 13.56 MHz or 27.12 MHz.

* * * * *